(12) United States Patent
Yoon et al.

(10) Patent No.: US 11,579,167 B2
(45) Date of Patent: Feb. 14, 2023

(54) PROBE FOR DETECTING NEAR FIELD AND NEAR-FIELD DETECTION SYSTEM INCLUDING THE SAME

(71) Applicant: Samsung Electronics Co., Ltd., Suwon-si (KR)

(72) Inventors: Jongmin Yoon, Incheon (KR); Namil Koo, Hwaseong-si (KR); Nagel Michael, Aachen (DE); Suhwan Park, Incheon (KR); Junbum Park, Suwon-si (KR); Inkeun Baek, Suwon-si (KR); Sion Lee, Suwon-si (KR)

(73) Assignee: Samsung Electronics Co., Ltd., Gyeonggi-Do (KR)

( * ) Notice: Subject to any disclaimer, the term of this patent is extended or adjusted under 35 U.S.C. 154(b) by 69 days.

(21) Appl. No.: 17/333,924

(22) Filed: May 28, 2021

(65) Prior Publication Data

US 2022/0082584 A1 Mar. 17, 2022

(30) Foreign Application Priority Data

Sep. 11, 2020 (KR) .................. 10-2020-0116947

(51) Int. Cl.
*G01Q 60/22* (2010.01)
*G01N 21/68* (2006.01)
*H05K 9/00* (2006.01)

(52) U.S. Cl.
CPC ............ *G01Q 60/22* (2013.01); *G01N 21/68* (2013.01); *H05K 9/0081* (2013.01)

(58) Field of Classification Search
CPC ................................ G01Q 60/18; G01N 21/68
See application file for complete search history.

(56) References Cited

U.S. PATENT DOCUMENTS 5,442,300 A * 8/1995 Nees ..................... G01Q 60/30
324/96
7,053,351 B2 5/2006 Li et al.
(Continued)

FOREIGN PATENT DOCUMENTS

KR 10-2006-0119464 A 11/2006
KR 10-2008-0094738 A 10/2008
(Continued)

OTHER PUBLICATIONS

Iwami et al. 'A New Approach to Terahertz Local Spectroscopy Using Microfabricated Scanning Near-Field Probe' Oct. 17, 2008, Japanese Journal of Applied Physics vol. 47, No. 10, pp. 8095-8097 (Year: 2008).*

(Continued)

*Primary Examiner* — Eliza W Osenbaugh-Stewart
(74) *Attorney, Agent, or Firm* — Harness, Dickey & Pierce, P.L.C.

(57) ABSTRACT

A near-field detection system includes include an electric field generator configured to apply an electric field to an analysis sample, a probe configured to detect a near field that has passed through the analysis sample, a current detector connected to the probe, and a laser system irradiating a laser to each of the electric field generator and the probe. The probe includes a cantilever substrate, an antenna electrode on the cantilever substrate, an electromagnetic wave blocking layer exposing a sensing region of the cantilever substrate, the electromagnetic wave blocking layer including a conductive material, and an insulating layer interposed between the cantilever substrate and the electromagnetic wave blocking layer such that the insulating layer is between the antenna electrode and the electromagnetic wave blocking layer.

20 Claims, 9 Drawing Sheets (56) References Cited

U.S. PATENT DOCUMENTS

| | | |
|---|---|---|
| 7,282,157 B2 | 10/2007 | Chiba et al. |
| 8,713,710 B2 | 4/2014 | Zhang et al. |
| 2003/0184328 A1* | 10/2003 | Lee .................. G01R 31/311 324/754.23 |
| 2003/0218257 A1 | 11/2003 | Ishio et al. |
| 2005/0003200 A1 | 1/2005 | Norley et al. |
| 2006/0083948 A1 | 4/2006 | Kawaguchi et al. |
| 2008/0054922 A1 | 3/2008 | Lesher et al. |

FOREIGN PATENT DOCUMENTS

| | | |
|---|---|---|
| KR | 10-1263367 B1 | 11/2012 |
| KR | 10-1290060 B1 | 7/2013 |
| KR | 10-2015-0089820 A | 8/2015 |

OTHER PUBLICATIONS

Chattacharya et al. 'Full Vectorail Mapping of the Complex Electric Near-Fields of THz Resonators' Nov. 18, 2016, APL Photonics, 086103 (Year: 2016).*

\* cited by examiner

PROBE FOR DETECTING NEAR FIELD AND NEAR-FIELD DETECTION SYSTEM INCLUDING THE SAME

CROSS-REFERENCE TO RELATED APPLICATION

This application claims benefit of priority to Korean Patent Application No. 10-2020-0116947 filed on Sep. 11, 2020 in the Korean Intellectual Property Office, the disclosure of which is incorporated herein by reference in its entirety.

BACKGROUND

Example embodiments of the present disclosure relate to a near field detection probe and/or a near field detecting system including the same.

With the trend for the advancement, integration, and miniaturization of technology, demands for high sensitivity and high spatial resolution in various measuring devices are increasing. In a far-field system such as far-field optical microscopy, the shorter the wavelength of light, the better the resolution, but there is a limitation in that the resolution thereof cannot be improved below a wavelength length, due to the diffraction of light. The limitation of the far-field system due to the wavelength can be overcome in a near-field system, so that a high-resolution measuring device and an ultra-high-density recording device can be manufactured.

SUMMARY

An example embodiment of the present inventive concepts relates to a near field detection probe capable of implementing high spatial resolution and/or a near field detection system including the same.

According to example embodiments, a near field detection probe, may include a cantilever substrate including a tip region, the tip region being shaped such that a width of an end portion of the tip region is less than a width of a region outside of the tip region the tip region including a sensing region at the end portion of the tip region; first and second antenna electrodes extending from the tip region along one surface of the cantilever substrate with the first antenna electrode being spaced apart from the second antenna electrode; an insulating layer surrounding the cantilever substrate and the first and second antenna electrodes; and an electromagnetic wave blocking layer surrounding the insulating layer in a region other than the sensing region, the electromagnetic wave blocking layer including a conductive material.

According to example embodiments, a near field detection probe may include a substrate including a tip region; an antenna electrode on the substrate; an electromagnetic wave blocking layer exposing a portion of the tip region of the substrate, the electromagnetic wave blocking layer including a conductive material; and an insulating layer interposed between the substrate and the electromagnetic wave blocking layer such that the insulating layer is between the antenna electrode on the substrate and the electromagnetic wave blocking layer.

According to example embodiments, a near-field detection system may include an electric field generator configured to apply an electric field to an analysis sample; a probe configured to detect a near field that has passed through the analysis sample, the probe including, a cantilever substrate, an antenna electrode on the cantilever substrate, an electromagnetic wave blocking layer exposing a sensing region of the cantilever substrate, the electromagnetic wave blocking layer including a conductive material, and an insulating layer interposed between the cantilever substrate and the electromagnetic wave blocking layer such that the insulating layer is between the antenna electrode and the electromagnetic wave blocking layer; a current detector connected to the probe; and a laser system irradiating a laser to each of the electric field generator and the probe.

BRIEF DESCRIPTION OF DRAWINGS

The above and other aspects, features, and advantages of the present inventive concepts will be more clearly understood from the following detailed description, taken in conjunction with the accompanying drawings, in which.

DETAILED DESCRIPTION

Hereinafter, some example embodiments of the present inventive concepts will be described with reference to the accompanying drawings.

Figure 1:
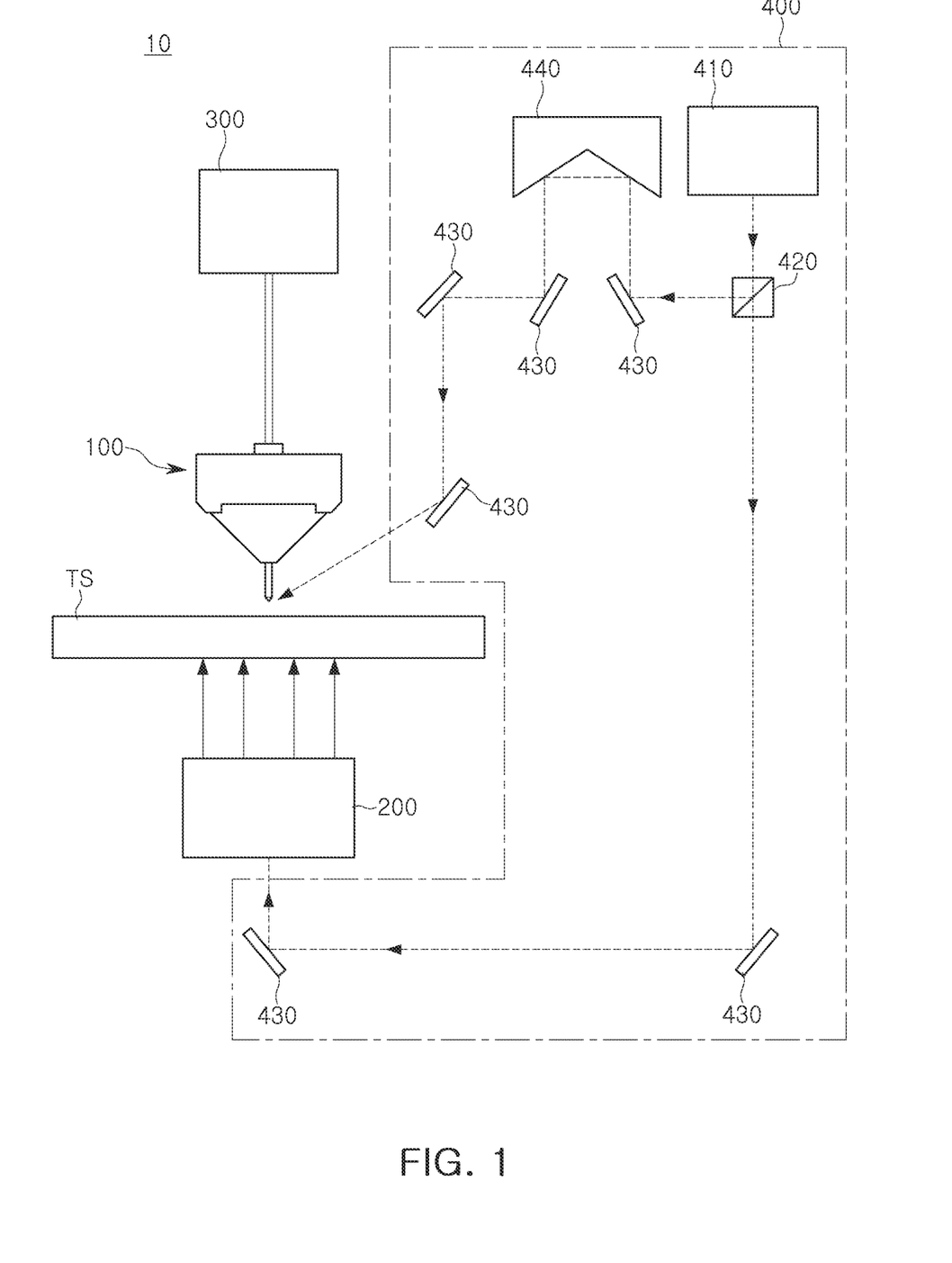
FIG. 1 is a schematic diagram illustrating a near field detection system according to example embodiments.
Figure 2:
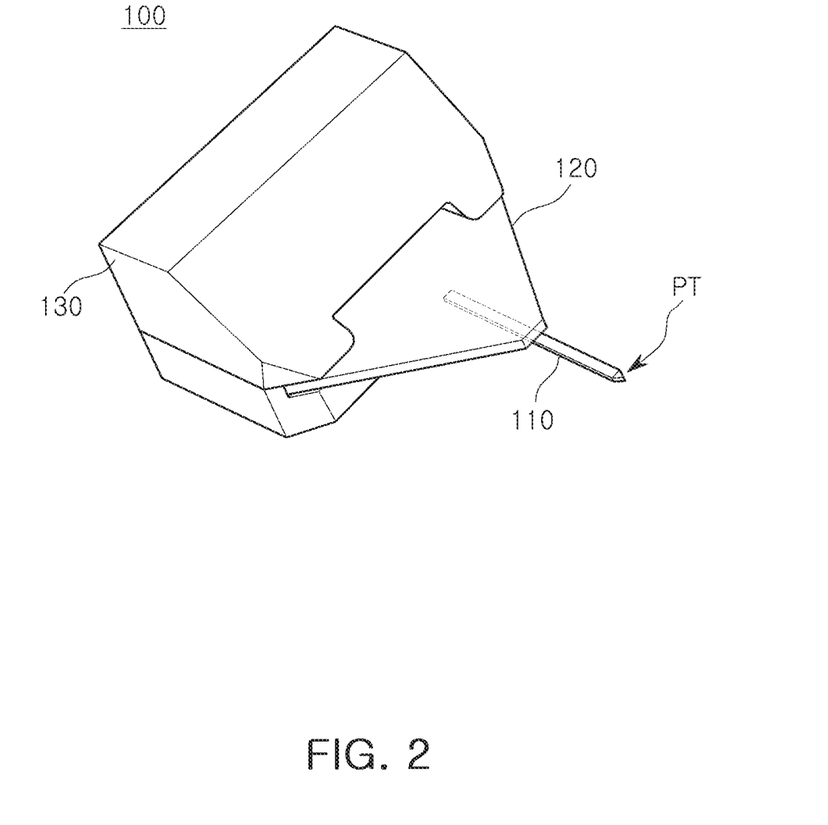
FIG. 2 is a schematic perspective view illustrating a sensing unit according to example embodiments.

FIG. 1 is a schematic diagram illustrating a near field detection system according to example embodiments. FIG. 2 is a schematic perspective view illustrating a sensing unit according to example embodiments.

Referring to FIG. 1, a near-field detection system 10 may include a sensing unit 100 detecting an electric field that has passed through an analysis sample TS on the analysis sample TS, an electric field generator 200 applying an electric filed to the analysis sample TS, a current detector 300 connected to the sensing unit 100, and a laser system 400 irradiating a laser to each of the electric field generator 200 and the sensing unit 100. The near-field detection system 10 may be an analysis system outputting an electric field from the electric field generator 200 and analyzing the analysis sample TS using the output. For example, the near field detection system 10 may be a photoconductive antenna based detector.

The electric field generator 200 may be positioned on one side of the analysis sample TS to generate an electromagnetic wave, for example, a terahertz wave, which is an electromagnetic field in a terahertz band, in the analysis sample TS. The electric field generator 200 may generate terahertz waves by a laser from the laser system 400. As shown in FIG. 1, the electric field generator 200 may be located below the analysis sample TS, opposite to the sensing unit 100 based on the analysis sample TS. However, according to example embodiments, the electric field generator 200 may also be positioned on one side of the sensing unit 100 above the analysis sample TS.

The sensing unit 100 may sense a near field that is output from the electric field generator 200 and transmitted through the analysis sample TS. The sensing unit 100 may include an antenna electrode, and carriers induced by a laser from the laser system 400 are accelerated by an electromagnetic wave transmitted through the analysis sample TS, so that a current may flow along the antenna electrode, and a near field can be detected by converting the same.

As shown in FIG. 2, the sensing unit 100 may include a near field detection probe 110, a support unit 120 connected to the probe 110, and a holding unit 130. The near field detection probe 110 for detecting a near field may be supported by the support unit 120 and connected to the holding unit 130, and may be connected to the current detector 300 through a connector connected to the holding unit 130. The near field detection probe 110 may include an electromagnetic wave blocking layer exposing a portion of the tip region PT. The near field detection probe 110 will be described in more detail below with reference to FIGS. 3A to 3C. The support unit 120 may be made of, for example, polyethylene terephthalate (PET). The holding unit 130 may be made of PET, polyvinyl chloride (PVC), or the like.

The current detector 300 may detect and analyze a current generated by the sensing unit 100 in response to a terahertz wave. A magnitude of the terahertz wave is changed to a magnitude of the current by the sensing unit 100, and the current detector 300 may detect the current and quantify the magnitude of the sensed terahertz wave. Since the terahertz wave has a relatively large frequency, it may be difficult to detect such wave with an electrical measuring instrument such as an oscilloscope, and can be detected using, for example, an electro-optical method.

For example, the electro-optical method may be photoconductive sampling, which may be an extraction method using an antenna. For example, the current detector 300 may measure a change in a sampling DC current due to interaction between a current along an antenna electrode of the sensing unit 100 and the terahertz wave from the electric field generator 200 as described above. To this end, a time delay of the laser reaching each of the sensing unit 100 and the electric field generator 200 may be induced by using a delay of the laser system 400 to change a sampling time of the terahertz wave. The current detector 300 may analyze the detection result, and may analyze a surface structure, thickness, and physical properties of the analysis sample TS by using the detection result.

In example embodiments, the near field detection system 10 may further include a computing system such as an analysis device, separate from the current detector 300 to perform an analysis operation for the analysis sample TS. For example, the analysis device may include processing circuitry such as hardware including logic circuits; a hardware/software combination such as a processor executing software; or a combination thereof and memory. For example, the processing circuitry more specifically may include, but is not limited to, a central processing unit (CPU), an arithmetic logic unit (ALU), a digital signal processor, a microcomputer, a field programmable gate array (FPGA), a programmable logic unit, a microprocessor, application-specific integrated circuit (ASIC), etc. The processing circuitry may execute software including a plurality of instructions that transform the processing circuitry into special purpose processing circuitry to perform the analysis operation on the analysis sample TS based on the detection result produced by the current detector 300.

The laser system 400 may irradiate a laser to each of the sensing unit 100 and the electric field generator 200. In the sensing unit 100, carriers may be generated by the irradiated laser. The electric field generator 200 may generate a terahertz wave toward the analysis sample TS by the irradiated laser. For example, in the electric field generator 200, the terahertz wave may be generated by a photoconductive antenna (PCA) method, an optical rectification method, or a semiconductor surface field method. In the photoconductive antenna method, an electron-hole pair is formed when a laser having an energy, greater than a bandgap energy is irradiated on a surface of a semiconductor on which an antenna electrode applied with a bias voltage is installed and then, a short instantaneous current flows between the antenna electrodes.

The photoconductive antenna method uses the principle of generating a terahertz wave, an electromagnetic wave proportional to a time derivative of this current. The optical rectification method uses a nonlinear optical characteristic generated by a strong optical signal, and uses a time-dependent polarization phenomenon occurring when an optical signal is received. The semiconductor surface electric field method uses the principle of generating a terahertz wave when an electron-hole pair formed on a surface of a semiconductor is accelerated by an electric field inherent in the semiconductor surface by irradiating a laser on a special semiconductor surface.

The laser system 400 may include a laser oscillator 410, a beam splitter 420, mirrors 430, and a delay 440. The laser oscillated from the laser oscillator 410 can be divided into two paths by the beam splitter 420, and the path may be changed by the mirrors 430, respectively, so that one may be irradiated to the sensing unit 100 and the other may be irradiated with the electric field generator 200. In order to obtain a terahertz wave waveform, a delay in time may be induced by placing the delay 440 in either of the two paths. In FIG. 1, the delay 440 is shown to be positioned in the path of the laser irradiated to the sensing unit 100, but is not limited thereto, and may be positioned in the path of the laser irradiated to the electric field generator 200. In example embodiments, the number and disposition of components of the laser system 400 may be variously changed. For example, the laser system 400 may include two laser oscillators oscillating a laser irradiated to each of the sensing unit 100 and the electric field generator 200.

Figure 3A:
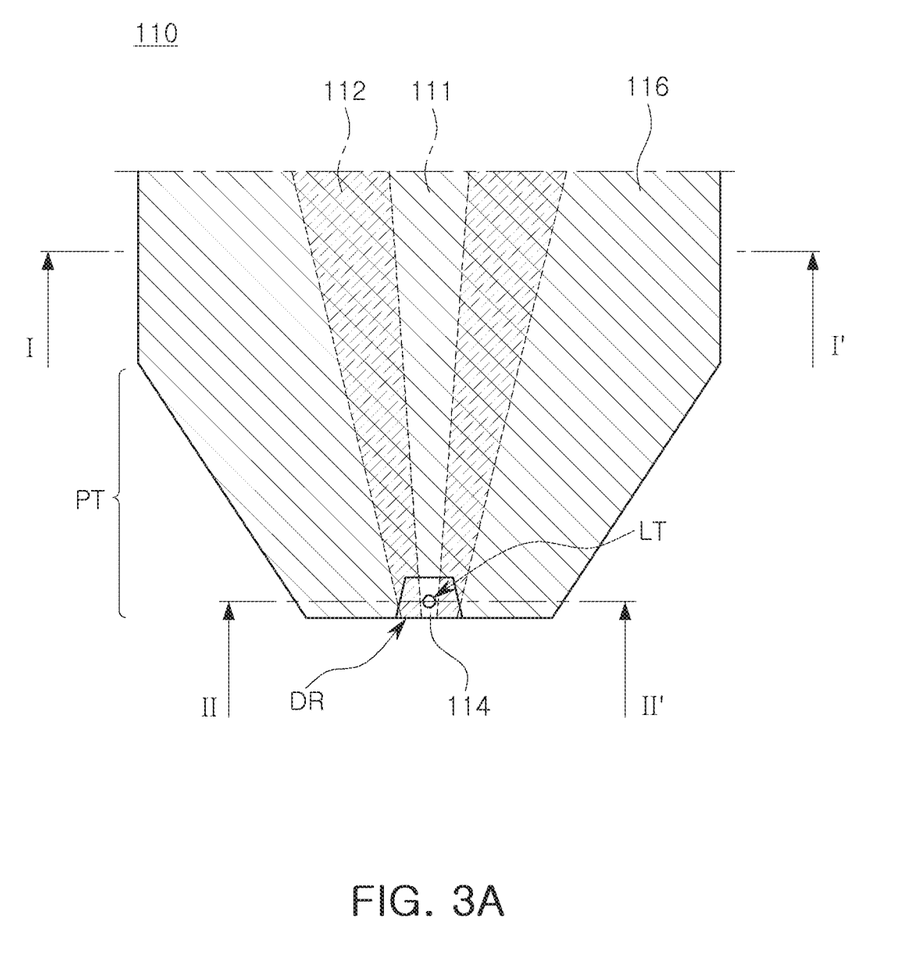
FIGS. 3A to 3C are schematic diagrams illustrating a near field detection probe according to example embodiments.
Figure 3B:
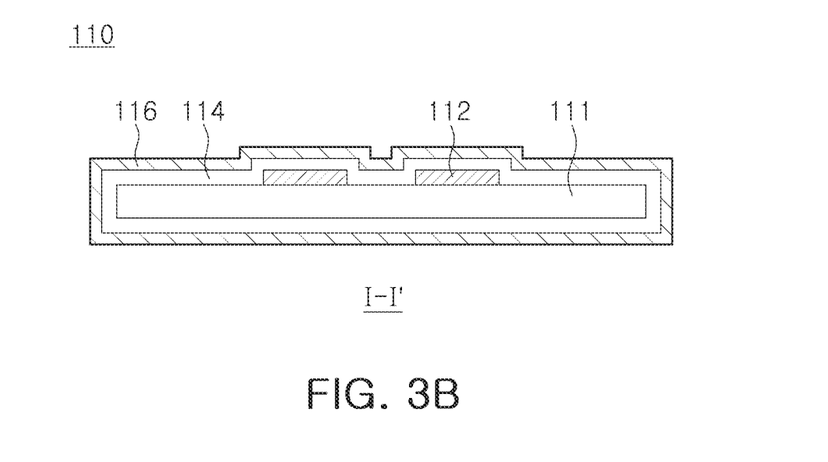
Figure 3C:
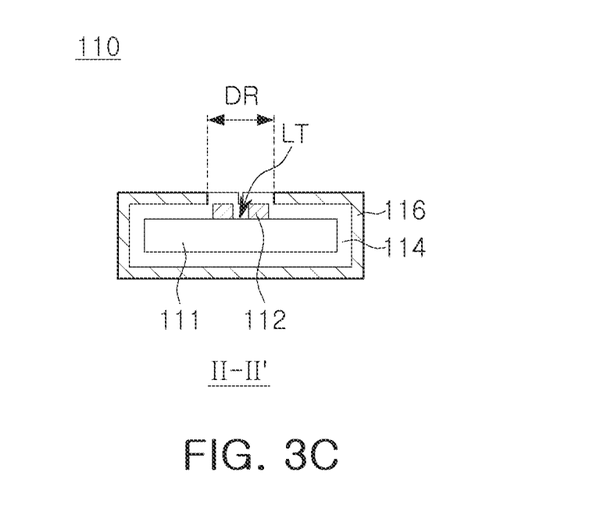

FIGS. 3A to 3C are schematic diagrams illustrating a near field detection probe according to example embodiments. FIG. 3A is a front view of a near field detection probe, and FIGS. 3B and 3C are cross-sectional views taken along cutting lines I-I' and II-II' of FIG. 3A, respectively.

Referring to FIGS. 3A to 3C, the near field detection probe 110 may include a cantilever substrate 111 having a tip region PT having a reduced width at an end portion thereof, antenna electrodes 112 on one surface of the cantilever substrate 111, an insulating layer 114 surrounding the cantilever substrate 111 and the antenna electrodes 112, and an electromagnetic wave blocking layer 116 disposed to cover the insulating layer 114 in a region other than the sensing region DR.

The cantilever substrate 111 may have a shape extending lengthwise to be attached to the support unit 120 of FIG. 2. However, the extension length, shape, or the like of the cantilever substrate 111 may be variously changed in example embodiments, and may be referred to as a substrate in the present specification. In the cantilever substrate 111, a tip region PT may be a region located adjacent to the analysis sample TS of FIG. 1 in order to detect an electromagnetic wave of a near field, for example, a terahertz wave, adjacent to an electromagnetic field generation or a diffraction point. For example, a distance between the near field detection probe 110 and the analysis sample TS may be about 10 μm or less, and may be, for example, in the range of about 1 μm to 3 μm, but is not limited thereto.

The cantilever substrate 111 may include a material reacting to a laser from the laser system 400 (see FIG. 1). The cantilever substrate 111 may include a semiconductor material, and may include, for example, a group IV semiconductor, a group III-V compound semiconductor, or a group II-VI compound semiconductor. For example, the cantilever substrate 111 may include at least one of gallium arsenide (GaAs), indium gallium arsenide (InGaAs), aluminum gallium arsenide (AlGaAs), indium aluminum gallium arsenide (InAlGaAs), gallium nitride (GaN), aluminum gallium nitride (AlGaN), indium gallium nitride (InGaN), and indium aluminum gallium nitride (InAlGaN). For example, the cantilever substrate 111 may include LT-gallium arsenide (GaAs) grown at a low temperature. The cantilever substrate 111 may include the above-described materials in a region including at least the tip region PT, and a region connected to the support unit 120 may include another material, for example PET.

The antenna electrodes 112 may be disposed on one surface of the cantilever substrate 111 and extend along the cantilever substrate 111 to be connected to the circuit pattern of the support unit 120. The antenna electrodes 112 may extend in a form of two lines spaced apart from each other. Each of the antenna electrodes 112 may have a shape in which a width increases while extending along the cantilever substrate 111 from an end portion. However, the pattern shape of the antenna electrodes 112 may be variously changed according to the configuration of the antenna in example embodiments. The antenna electrodes 112 may include a conductive material, for example, a metal material such as at least one of gold (Au), silver (Ag), copper (Cu), aluminum (Al), and platinum (Pt). In example embodiments, the antenna electrodes 112 may be omitted depending on the near field detection system in which the near field detection probe 110 is used.

The insulating layer 114 may be disposed to surround the cantilever substrate 111 and the antenna electrodes 112 as shown in FIG. 3B. The insulating layer 114 may be disposed to surround the entire upper, lower, and side surfaces of the cantilever substrate 111 and the antenna electrodes 112 based on the direction shown in FIG. 3B. In addition, the insulating layer 114 may be disposed so as to surround the lower end portions of the cantilever substrate 111 and the antenna electrodes 112 at the end portions of the cantilever substrate 111 with reference to FIG. 3A. That is, in FIG. 1, the lower surfaces of the cantilever substrate 111 and the antenna electrodes 112 when the near field detection probe 110 is viewed in the direction of the analysis sample TS may be covered with the insulating layer 114.

The insulating layer 114 may be a layer for electrically separating the cantilever substrate 111 and the antenna electrodes 112 from the electromagnetic wave blocking layer 116. The insulating layer 114 may be interposed between the cantilever substrate 111 and the electromagnetic wave blocking layer 116, and between the antenna electrodes 112 and the electromagnetic wave blocking layer 116.

The insulating layer 114 may be made of an insulating material, and may be made of a material capable of transmitting a laser. The insulating layer 114 may include, for example, a photo curable resin, and in particular, may include a hydrosulfide-based photo curable resin. The insulating layer 114 may include, for example, Norland Optical Adhesive 65 (NOA65) manufactured by Norland. In this case, the insulating layer 114 may be formed by being coated on the cantilever substrate 111 and the antenna electrodes 112 using, for example, a micropipette and curing with UV light.

The electromagnetic wave blocking layer 116 may be disposed on the insulating layer 114 in a region other than a sensing region DR. The sensing region DR may correspond to a portion of the tip region PT including an end portion of the near field detection probe 110. The sensing region DR may be defined as a region in which the electromagnetic wave blocking layer 116 is not disposed.

The sensing region DR may include a region in which electromagnetic waves are sensed, and may include a laser target region LT. The laser target region LT may be a region, irradiated with a laser from the laser system 400 (see FIG. 1). The laser target region LT may be positioned between the antenna electrodes 112 in a region adjacent to the end portions of the antenna electrodes 112. The electromagnetic wave blocking layer 116 may block an electric field that reaches the near field detection probe 110 in a region other than the sensing region DR. The electromagnetic wave blocking layer 116 may limit a region in which the electric field is sensed in the near field detection probe 110, so that spatial resolution can be improved. For example, by the electromagnetic wave blocking layer 116, it may be inhibited (or, alternatively, prevented) from decreasing in spatial resolution caused by detecting an electric field in an unnecessary region (e.g., a region other than between the antenna electrodes 112 of the near field detection probe 110).

The electromagnetic wave blocking layer 116 may be disposed to surround the upper, lower, and side surfaces of the insulating layer 114 in a region other than the sensing region DR, based on the direction shown in FIG. 3C. The sensing region DR may be a region extending from a front surface to a lower surface of the cantilever substrate 111 and the antenna electrodes 112 with reference to FIG. 3A. Accordingly, in FIG. 1, when the near field detection probe 110 is viewed in the direction of the analysis sample TS, the lower surfaces of the cantilever substrate 111 and the antenna electrodes 112 in the sensing region DR is covered with the insulating layer 114, but may not be covered with the electromagnetic wave blocking layer 116. The electromagnetic wave blocking layer 116 may be disposed so as not to cover the laser target region LT between the antenna electrodes 112 in the sensing region DR. The sensing region DR may include at least a portion of the end portions of the antenna electrodes 112, but is not limited thereto. In example embodiments, the range of the sensing region DR may be variously changed. Accordingly, in example embodiments, a range in which the cantilever substrate 111 is exposed on both sides of the antenna electrodes 112 may be variously changed.

The electromagnetic wave blocking layer 116 may include a conductive material to block electromagnetic waves, and may have a thickness equal to or greater than a critical thickness. The critical thickness may correspond to a skin depth, according to a skin effect, and the skin depth may be calculated with a frequency of the electromagnetic waves, resistivity of the electromagnetic wave blocking layer 116, and permeability of the electromagnetic wave blocking layer 116. For example, the electromagnetic wave blocking layer 116 may have a thickness ranging from about 100 nm to about 3 μm, but is not limited thereto.

The electromagnetic wave blocking layer 116 may include, for example, a metallic material, graphite, or the like. The electromagnetic wave blocking layer 116 may include, for example, a photo curable resin, and may further include conductive powder such as metal powder or graphite powder. In this case, a material having excellent adhesiveness and low volume shrinkage and stress generation during curing may be selected as the resin, and a material having a low thermal expansion coefficient may be selected as the conductive powder. The electromagnetic wave blocking layer 116 may include, for example, NOA65, which is a hydrosulfide-based photo curable resin, and graphite powder. In this case, the electromagnetic wave blocking layer 116 may be formed by being coated on a part of the insulating layer 114 using, for example, a micropipette and cured with UV light.

As a material of the electromagnetic wave blocking layer 116, as a result of applying copper (Cu), a zinc (Zn)/aluminum (Al) composite material, and graphite, respectively, by using a metal spray coating method, a result that warpage or damage is generated on the probe or coating cannot be maintained was obtained. When NOA 65 and silver (Ag) powder were mixed and used, the coating was partially fell during photo curing, and when NOA 65 and aluminum (Al) powder were mixed and used, disturbance of the probe signal occurred. When NOA 65 and graphite powder are mixed and used, since graphite has conductivity similar to that of metal and has a lower coefficient of thermal expansion than metal, coating can be performed without physical deformation and no signal disturbance occurred. For example, NOA 65 and graphite powder may be mixed and used in a ratio of about 3:1 to about 5:1, for example, 4:1.

Figure 4A:
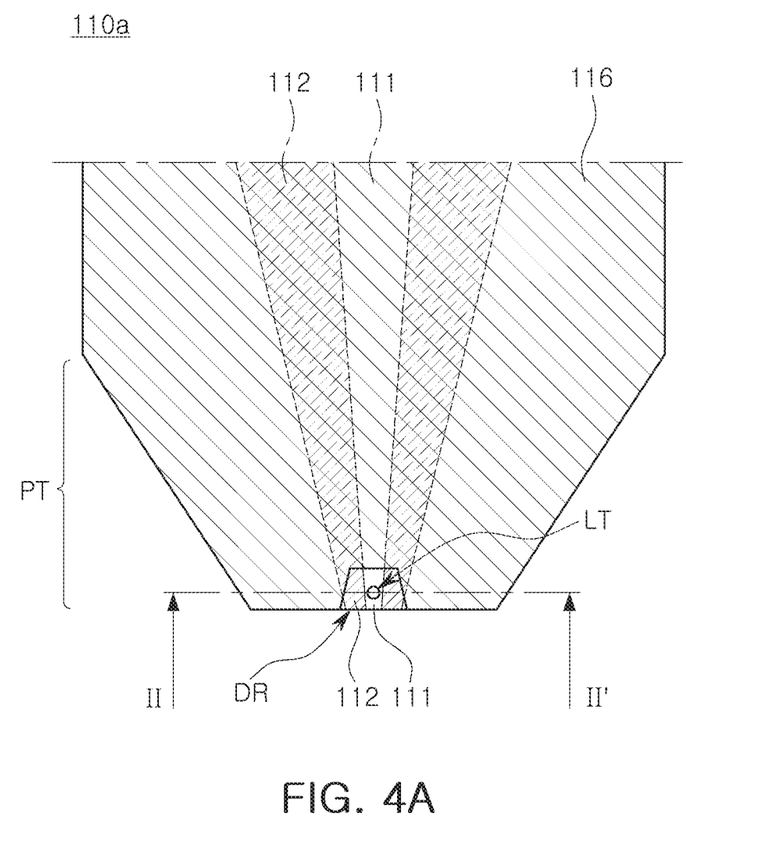
FIGS. 4A and 4B are schematic front views and cross-sectional views illustrating a near field detection probe according to example embodiments.
Figure 4B:
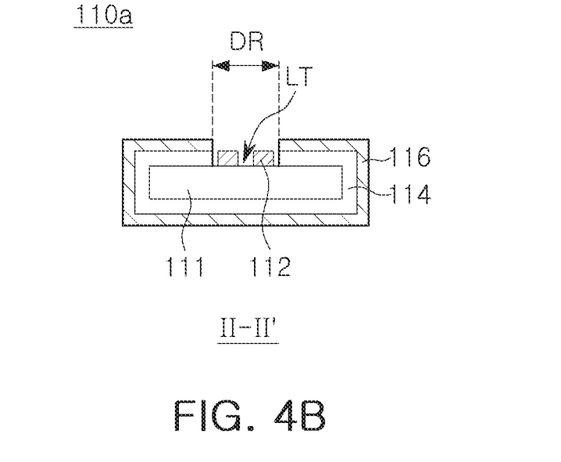

FIGS. 4A and 4B are schematic front views and cross-sectional views illustrating a near field detection probe according to example embodiments. FIG. 4B is a cross-sectional view taken along the cut line II-II' of FIG. 4A.

Referring to FIGS. 4A and 4B, unlike the example embodiment of FIGS. 3A to 3C, a near field detection probe 110a may have a structure in which an insulating layer 114 does not remain in a sensing region DR. The insulating layer 114 may be disposed to surround a cantilever substrate 111 and antenna electrodes 112 in a region other than the sensing region DR. The insulating layer 114 may be disposed so as to surround upper, lower, and side surfaces of the cantilever substrate 111 and the antenna electrodes 112 based on a direction shown in FIG. 4B. The insulating layer 114 of the present example embodiment may be made of an insulating material, and may be selected regardless of whether or not to transmit a laser.

An electromagnetic wave blocking layer 116 may be disposed on the insulating layer 114 in a region other than the sensing region DR. In FIG. 4B, end portions of the insulating layer 114 and the electromagnetic wave blocking layer 116 are illustrated to have side surfaces that are coplanar with each other, but the present inventive concepts are not limited thereto. For example, the electromagnetic wave blocking layer 116 may have the end portions shifted from the end portions of the insulating layer 114 to partially expose the end portions of the insulating layer 114.

Figure 5A:
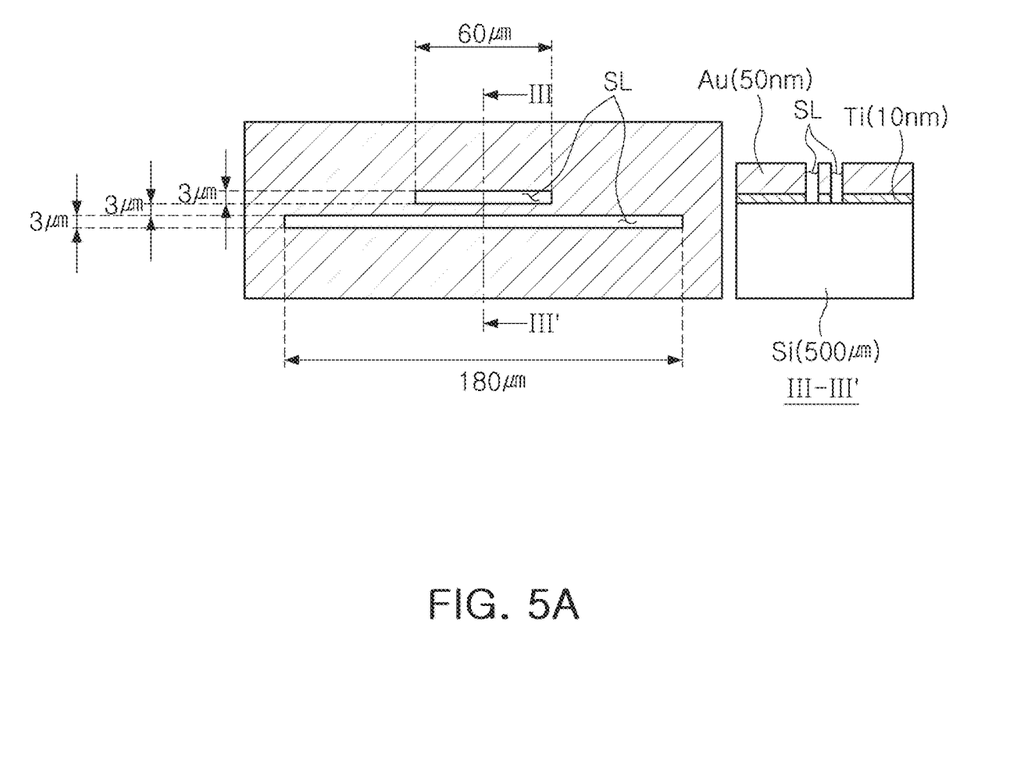
FIGS. 5A to 5D are diagrams for explaining a result of measuring a surface of an analysis sample using a near field detection probe according to example embodiments.
Figure 5B:
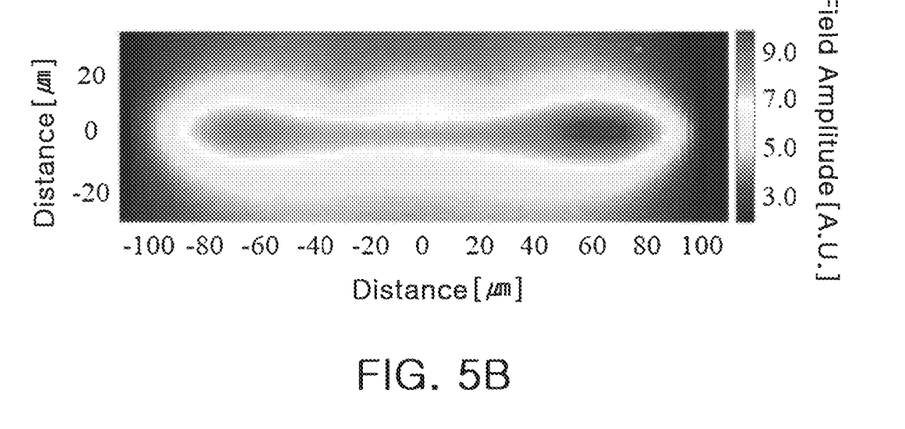
Figure 5C:
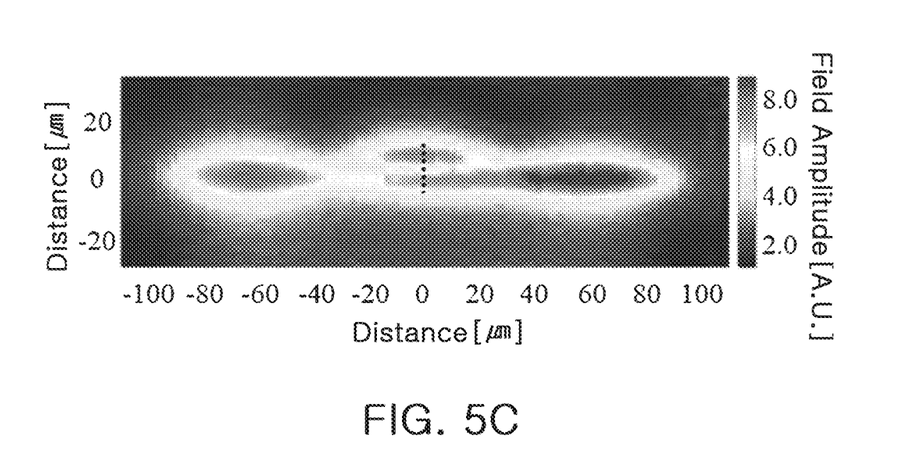
Figure 5D:
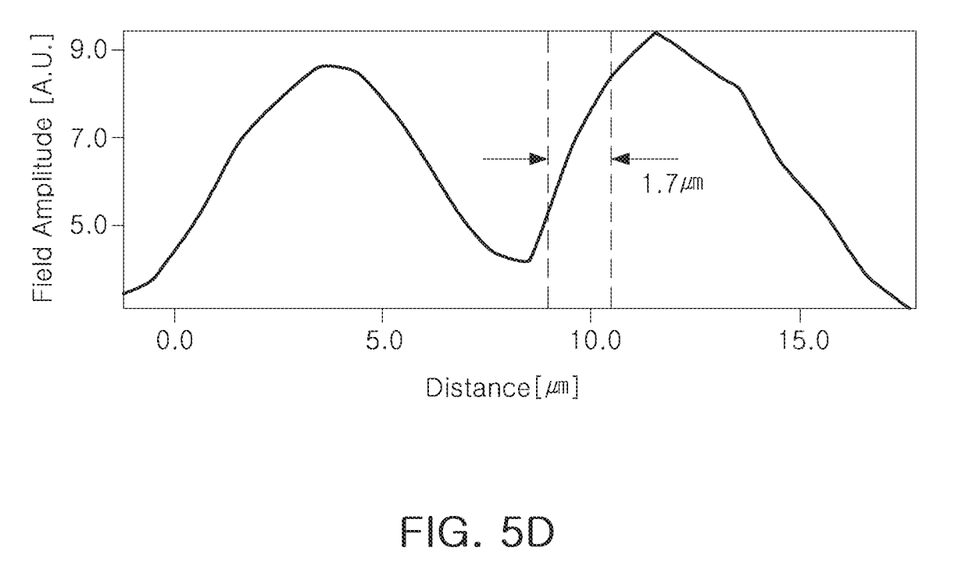

FIGS. 5A to 5D are diagrams for explaining a result of measuring a surface of an analysis sample using a near field detection probe according to example embodiments. FIG. 5A includes a plan view of an analysis sample and a cross-sectional view taken along a cutting line III-III', FIG. 5B is a measurement result using a probe of Comparative example, and FIG. 5C is a measurement result using a probe of Example. FIG. 5D shows intensity of the near field along a region indicated by the dotted line in FIG. 5C.

Referring to FIG. 5A, in order to check spatial resolution of the near field detection probe, an analysis sample including metal patterns in which metal slits of an interval of 3 μm are formed was used. The analysis sample includes a metal structure of an undoped 500 μm silicon (Si) layer, and a 10 nm titanium (Ti) layer and a 50 nm gold (Au) layer stacked on the silicon layer. Slit regions SL were formed in the metal structure with a width and an interval of 3 μm.

Referring to FIGS. 5B and 5C, a result of performing an electromagnetic wave transmission imaging test of 0.9 THz frequency for the analysis sample using the probes of Comparative Examples and Examples, respectively, are shown. The probe of the Comparative Example does not have the electromagnetic wave blocking layer 116 described above with reference to FIGS. 3A to 3C, and thus is a probe without the insulating layer 114. The probe of the Example is the probe of the example embodiment described above with reference to FIGS. 3A to 3C. As shown in FIG. 5B, as a result of using the probe of the Comparative Example, the slit region SL was not distinguished. However, when the probe of the Example is used, as shown in FIG. 5C, the slit regions SL were distinguished.

Referring to FIG. 5D, intensity of the transmission near field along the dotted line in FIG. 5C is shown. When a distance between a point at which the intensity of the electric field, which is a near field, is 20% and a point at which the intensity of the electric field is 80%, is defined as spatial resolution, as a result of using the probe of the Example, a spatial resolution of about 1.7 μm was obtained. Thereby, it can be seen that a spatial resolution of about 3 μm or less, in particular, a spatial resolution of about 2 μm or less, is implemented using the near field detection probe according to example embodiments. For example, a spatial resolution of about 1.5 μm to about 1.9 μm may be obtained by using the near field detection probe according to example embodiments.

Figure 6A:
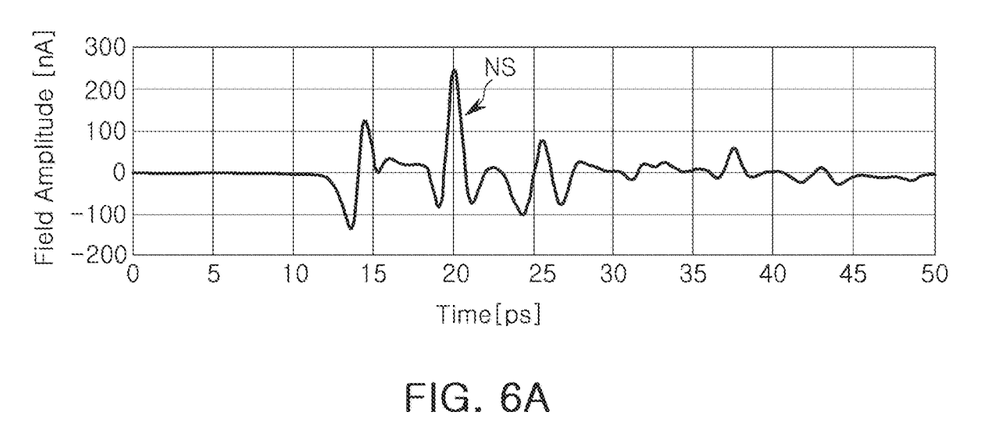
FIGS. 6A and 6B are diagrams for explaining a result of analyzing an effect by internal reflection using a near field detection probe according to example embodiments.
Figure 6B:
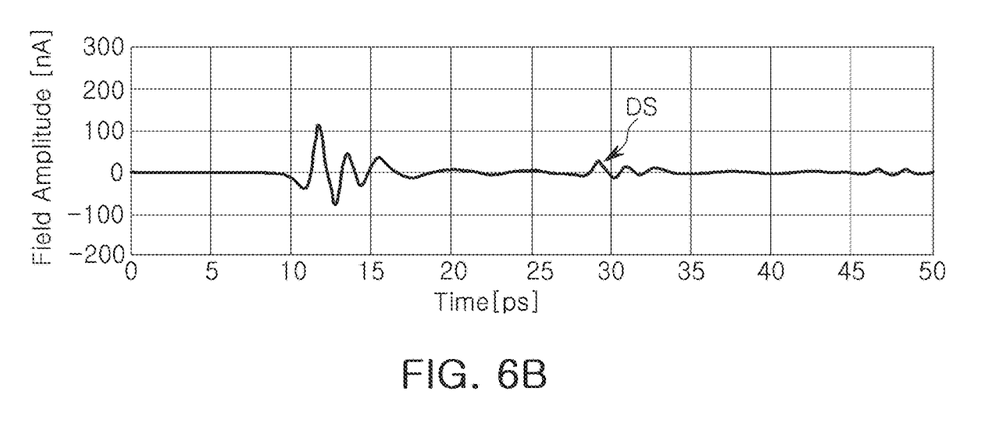

FIGS. 6A and 6B are diagrams for explaining a result of analyzing an effect by internal reflection using a near field detection probe according to example embodiments.

Referring to FIGS. 6A and 6B, a result of measuring a time domain pulse that has passed through an analysis sample using the probes of Comparative Examples and example embodiments, respectively, are shown. A silicon (Si) wafer was used as the analysis sample. When the probe of the Comparative Example is used, electromagnetic waves are reflected at a heterogeneous interface in the cantilever substrate 111 of FIG. 3A, for example, an interface between a semiconductor material and a PET material, and sensed in a sensing region DR. As a result, as shown in FIG. 6A, a waveform NS is generated due to pulse distortion.

However, when the probe of example embodiments is used, as shown in FIG. 6B, noise due to electromagnetic waves reflected from the interface between such internal heterogeneous materials may be reduced, thereby a secondary transmission signal DS can be easily recognized. The secondary transmitted signal DS is a wave reflected and transmitted from an upper surface and a lower surface of the analysis sample, and corresponds to a normal waveform for analysis of the analysis sample. Accordingly, according to the probe of the Example, noise due to unnecessary internal reflection can be reduced, and secondary transmission waves can be visualized.

As set forth above, by including an electromagnetic wave blocking layer, a near field detection probe capable of implementing high spatial resolution and a near field detecting system including the same may be provided.

The various and advantageous advantages and effects of the present inventive concepts are not limited to the above description, and may be more easily understood in the course of describing the example embodiments of the present inventive concepts.

While some example embodiments have been shown and described above, it will be apparent to those skilled in the art that modifications and variations could be made without departing from the scope of example embodiments of the present inventive concepts as defined by the appended claims.

What is claimed is:

1. A near field detection probe, comprising:
a cantilever substrate including a tip region, the tip region being shaped such that a width of an end portion of the tip region is less than a width of a region outside of the tip region, the tip region including a sensing region at the end portion of the tip region;
first and second antenna electrodes extending from the tip region along one surface of the cantilever substrate with the first antenna electrode being spaced apart from the second antenna electrode;
an insulating layer surrounding the cantilever substrate and the first and second antenna electrodes; and
an electromagnetic wave blocking layer surrounding the insulating layer in a region other than the sensing region, the electromagnetic wave blocking layer including a conductive material.

2. The near field detection probe of claim 1, wherein the sensing region is between the first and second antenna electrodes at the end portion of the tip region.

3. The near field detection probe of claim 2, wherein a laser target region to which a laser is irradiated to the cantilever substrate from an outside is within the sensing region.

4. The near field detection probe of claim 1, wherein the electromagnetic wave blocking layer is configured to expose the insulating layer within the sensing region.

5. The near field detection probe of claim 1, wherein the electromagnetic wave blocking layer is configured to expose the cantilever substrate within the sensing region.

6. The near field detection probe of claim 1, wherein the insulating layer comprises:
a hydrosulfide-based photo curable resin.

7. The near field detection probe of claim 1, wherein the electromagnetic wave blocking layer comprises:
a graphite powder.

8. The near field detection probe of claim 7, wherein the electromagnetic wave blocking layer further comprises:
a hydrosulfide-based photo curable resin.

9. The near field detection probe of claim 1, wherein the cantilever substrate comprises:
a semiconductor material.

10. The near field detection probe of claim 1, wherein
the insulating layer surrounds an upper surface, a lower surface, and side surfaces of the cantilever substrate, when viewed from the end portion of the tip region, and
the electromagnetic wave blocking layer surrounds an upper surface, a lower surface, and side surfaces of the insulating layer outside the sensing region, when viewed from the end portion of the tip region.

11. A near field detection probe, comprising:
a substrate including a tip region;
an antenna electrode on the substrate;
an electromagnetic wave blocking layer exposing a portion of the tip region of the substrate, the electromagnetic wave blocking layer including a conductive material; and
an insulating layer interposed between the substrate and the electromagnetic wave blocking layer such that the insulating layer is between the antenna electrode on the substrate and the electromagnetic wave blocking layer.

12. The near field detection probe of claim 11, wherein the electromagnetic wave blocking layer exposes a region adjacent to the antenna electrode.

13. The near field detection probe of claim 11, wherein
the substrate includes a semiconductor material, and
the electromagnetic wave blocking layer includes a metal powder or a graphite powder.

14. The near field detection probe of claim 11, wherein the insulating layer and the electromagnetic wave blocking layer each comprise:
a photo curable resin.

15. The near field detection probe of claim 11, wherein the electromagnetic wave blocking layer has a thickness in a range of about 100 nm to about 3 μm.

16. A near-field detection system, comprising:
an electric field generator configured to apply an electric field to an analysis sample;
a probe configured to detect a near field that has passed through the analysis sample, the probe including,
a cantilever substrate,
an antenna electrode on the cantilever substrate,
an electromagnetic wave blocking layer exposing a sensing region of the cantilever substrate, the electromagnetic wave blocking layer including a conductive material, and
an insulating layer interposed between the cantilever substrate and the electromagnetic wave blocking layer such that the insulating layer is between the antenna electrode and the electromagnetic wave blocking layer;
a current detector connected to the probe; and
a laser system irradiating a laser to each of the electric field generator and the probe.

17. The near-field detection system of claim 16, wherein the antenna electrode comprises:
first and second antenna electrodes spaced apart from each other,
wherein the laser system is configured to irradiate the laser to a laser target region between the first and second antenna electrodes within the sensing region.

18. The near-field detection system of claim 16, wherein the electric field generator and the probe are at a first side and a second side of the analysis sample, respectively.

19. The near-field detection system of claim 16, wherein the electromagnetic wave blocking layer is configured to block the electric field from reaching the probe outside of the sensing region.

20. The near-field detection system of claim 16, wherein a spatial resolution of the near field measured by the probe is less than about 3 μm.

* * * * *